(12) United States Patent
Kim et al.

(10) Patent No.: US 8,399,998 B2
(45) Date of Patent: Mar. 19, 2013

(54) SEMICONDUCTOR PACKAGE REQUIRING REDUCED MANUFACTURING PROCESSES

(75) Inventors: Ki Young Kim, Gyeonggi-do (KR); Sung Ho Hyun, Seoul (KR); Myung Geun Park, Seoul (KR); Woong Sun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 423 days.

(21) Appl. No.: 12/604,601

(22) Filed: Oct. 23, 2009

(65) Prior Publication Data

US 2011/0031604 A1 Feb. 10, 2011

(30) Foreign Application Priority Data

Aug. 10, 2009 (KR) .................. 10-2009-0073509

(51) Int. Cl.
*H01L 23/48* (2006.01)
(52) U.S. Cl. ......... 257/784; 257/684; 257/686; 257/690
(58) Field of Classification Search .................. 257/684, 257/686, 690, 784
See application file for complete search history.

(56) References Cited

U.S. PATENT DOCUMENTS

| | | |
|---|---|---|
| 5,657,537 A | 8/1997 | Saia et al. |
| 6,369,454 B1 * | 4/2002 | Chung ........................ 257/787 |
| 2009/0039523 A1 * | 2/2009 | Jiang et al. ..................... 257/777 |
| 2009/0039526 A1 * | 2/2009 | Wang et al. ..................... 257/777 |
| 2009/0056121 A1 * | 3/2009 | Sasaki et al. ..................... 29/854 |

FOREIGN PATENT DOCUMENTS

| | | | |
|---|---|---|---|
| JP | 2001-210782 | * | 8/2001 |
| JP | 2001-210782 A | | 8/2001 |
| KR | 1020000047069 A | | 7/2000 |
| KR | 1020090009737 A | | 1/2009 |
| KR | 10-0886200 B1 | | 2/2009 |
| KR | 100886200 | * | 2/2009 |

* cited by examiner

*Primary Examiner* — Zandra Smith
*Assistant Examiner* — Jamie C Niesz
(74) *Attorney, Agent, or Firm* — Ladas & Parry LLP

(57) ABSTRACT

A semiconductor package includes a semiconductor chip having a first surface, a second surface located opposite the first surface, and side surfaces connecting the first and second surfaces. The semiconductor chip includes bonding pads disposed on the first surface and having a molding member formed to cover the first surface of the semiconductor chip. The molding member is formed so as to expose the side surfaces of the semiconductor chip. The semiconductor chip also includes bonding members having first ends electrically connected to the respective bonding pads and second ends that are connected to and opposite the first ends. The second ends are exposed from side surfaces of the molding member after passing through the molding member so as to allow various electrical connections.

15 Claims, 10 Drawing Sheets

SEMICONDUCTOR PACKAGE REQUIRING REDUCED MANUFACTURING PROCESSES

CROSS-REFERENCE TO RELATED APPLICATIONS

The present application claims priority to Korean patent application number 10-2009-0073509 filed on Aug. 10, 2009, which is incorporated herein by reference in its entirety.

BACKGROUND OF THE INVENTION

The present invention relates generally to a semiconductor package, and more particularly, to a semiconductor package requiring reduced manufacturing processes and having more durable bonding members.

Developments in the semiconductor industry including the semiconductor chip and the package in which the chip is formed have made it possible to both store and process a massive amount of data within a short period of time.

Recently, a wafer level package has been developed having a size no greater than about 100~105% of a semiconductor chip size. A conventional wafer level package includes a semiconductor chip having bonding pads, redistribution lines that are electrically connected with the bonding pads, an insulation layer that exposes portions of the redistribution lines, and conductive balls that are attached to the portions of the redistribution lines exposed through the insulation layer.

In order to form the redistribution lines according to the conventional wafer level package, complicated processes such as a thin film patterning process, a plating process, and so forth, are required. In addition to the required processes, a problem occurs where the redistribution lines are likely to partially break or be damaged during formation. The redistribution lines disposed on the semiconductor chip can also easily break due to stress induced as a result of expansion and contraction of the semiconductor chip.

BRIEF SUMMARY OF THE INVENTION

Embodiments of the present invention are directed to a semiconductor package which decreases the number of manufacturing processes thereby reducing the manufacturing cost and preventing defects from being caused during the manufacturing processes, and has bonding members more unlikely to break by a stress induced due to expansion and contraction of a semiconductor chip.

In one embodiment of the present invention, a semiconductor package comprises a semiconductor chip possessing a first surface, a second surface which faces away from the first surface and side surfaces which connect the first and second surfaces, and having bonding pads which are disposed on the first surface; a molding member covering the first surface of the semiconductor chip and exposing the side surfaces of the semiconductor chip; and bonding members having first ends which are electrically connected with the respective bonding pads and second ends which are connected with the first ends and are exposed from side surfaces of the molding member after passing through the molding member.

The semiconductor package may further comprise enlarged pads disposed on the side surfaces of the molding member and electrically connected with the second ends of the bonding members.

The semiconductor package may further comprise additional bonding members each electrically connecting at least two of the second ends of the bonding members which are exposed from the side surfaces of the molding member.

Each additional bonding member may comprise any one selected from the group consisting of a conductive wire, a conductive tape, a conductive ink, a metal pattern, an anisotropic conductive film and a conductive polymer substance.

The second ends of the bonding members, which are exposed from the side surfaces of the molding member, may have the sectional shape of any one of a point, a line and an area.

The semiconductor package may further comprise a substrate on which the second surface of the semiconductor chip is placed, the substrate having connection pads which are disposed outside the semiconductor chip; and connecting members electrically connecting the second ends of the bonding members which are exposed from the side surfaces of the molding member and the connection pads.

Each connecting member may comprise any one selected from the group consisting of a conductive wire, a conductive tape, a conductive ink, a metal pattern, an anisotropic conductive film and a conductive polymer substance.

The semiconductor package may further comprise a substrate on which the side surface of the semiconductor chip is placed, the substrate having connection pads which are electrically connected with the second ends of the bonding members.

The semiconductor package may further comprise a substrate on which second surfaces of at least two semiconductor chips are stacked, the substrate having bent portions and connection pads which are electrically connected with second ends of bonding members.

The molding member may have openings which expose second end portions of the bonding members.

The semiconductor package may further comprise a first substrate having a first substrate body which contacts the second surface of the semiconductor chip, and first metal lines which have first ends disposed on a lower surface of the first substrate body and second ends disposed on side surfaces of the first substrate body; a second substrate having a second substrate body which is placed on the molding member, and second metal lines which have first ends disposed on an upper surface of the second substrate body and second ends disposed on side surfaces of the second substrate body; and connecting members electrically connecting the second ends of the first and second metal lines.

The semiconductor package may further comprise an additional semiconductor package electrically connected with the first ends of the second metal lines.

Each of the second ends of the bonding members may have a shape which is bent at least one time on the side surface of the molding member.

The bonding members may comprise a conductive lead frame which has the shape of a band.

The bonding members may comprise conductive bonding wires.

Grooves may be concavely defined on the side surfaces of the molding member to expose second end portions of the bonding members from the molding member, and solders balls may be filled in the grooves and are electrically connected with the second end portions of the bonding members.

The semiconductor package may further comprise through-electrodes disposed in through-holes which are defined to pass through the semiconductor chip, the molding member and the bonding members, and electrically connected with the bonding members.

The semiconductor package may further comprise recesses concavely defined on the side surfaces of the molding member in the shape of grooves to each expose at least two of the second ends of the bonding members; and additional bonding members disposed in the recesses to electrically connect the second ends which are exposed in the respective recesses.

The semiconductor package may further comprise insulating members disposed in the recesses to insulate the additional bonding members from one another.

The molding member may cover the side surfaces of the semiconductor chip.

DESCRIPTION OF SPECIFIC EMBODIMENTS

It is understood herein that the drawings are not necessarily illustrated to scale and in some instances the proportions may be exaggerated in order to more clearly depict certain features and aspects of the present invention.

Figure 1:
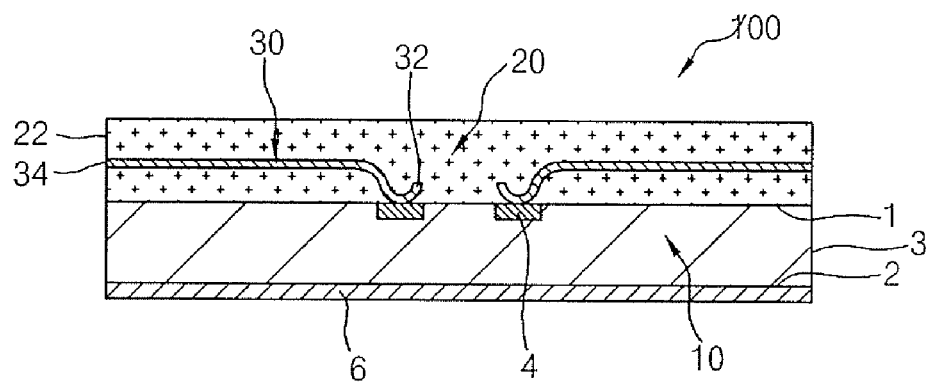
FIG. 1 is a cross-sectional view showing a semiconductor package in accordance with an embodiment of the present invention.

FIG. 1 is a cross-sectional view showing a semiconductor package in accordance with an embodiment of the present invention.

Referring to FIG. 1, a semiconductor package 100 includes a semiconductor chip 10, a molding member 20, and bonding members 30.

The semiconductor chip 10 may comprise any one of a data semiconductor chip for storing data and/or a system semiconductor chip for processing data.

The semiconductor chip 10 may be configured in any known geometric shape. A preferred configuration for the semiconductor chip 10 is that of a rectangular hexahedron shape. The semiconductor chip 10 having the rectangular hexahedron shape has a first surface 1, a second surface 2 which faces away and is opposite the first surface 1, and side surfaces 3 which electrically connect the first and second surfaces 1 and 2. In an embodiment of the present invention, the semiconductor chip 10 has, e.g., four side surfaces 3.

The semiconductor chip 10 has a circuit section (not shown) and bonding pads 4 formed on the first surface 1.

The circuit section includes a data-storing unit for storing data and/or a data processing unit for processing data depending on the type of semiconductor chip.

The bonding pads 4 are disposed on the first surface 1 of the semiconductor chip 10. For example, the bonding pads 4 are formed in one or two rows in a central portion of the first surface 1 of the semiconductor chip 10. The central portion being an area of the first surface 1 centrally located with respect to the side surfaces 3. The bonding pads 4 are electrically connected with the circuit section.

A sheet-like adhesive member 6 may be placed on the second surface 2 of the semiconductor chip 10. Alternatively, an adhesive can be placed on the second surface 2 of the semiconductor chip 10.

The molding member 20 is placed on the first surface 1 of the semiconductor chip 10. In an embodiment of the present invention, the molding member 20 is formed of a molding substance such as epoxy resin.

In the embodiment of the present invention shown in FIG. 1, the molding member 20 covers the first surface 1 of the semiconductor chip 10, but does not cover the side surfaces 3, thereby allowing the side surfaces 3 of the semiconductor chip 10 to remain exposed. That is to say, the molding member 20 is placed only on the first surface 1 of the semiconductor chip 10.

The bonding members 30 are disposed within the molding member 20. The bonding members 30 can comprise, e.g., conductive wires or a conductive lead frame.

First ends 32 of the bonding members 30 are electrically connected with the respective bonding pads 4 of the semiconductor chip 10. Second ends 34 of the bonding members 30 opposite the first ends 32 are exposed from side surfaces 22 of the molding member 20 with the bonding members 30 extending through the molding member 20. That is to say, the bonding members 30 are disposed within the molding member 20 having a second end 34 exposed from a side surface 22 of the molding member 20 and contacting a bonding pad 4 at a first end 32.

In an embodiment of the present invention, the bonding members 30 are separated from the first surface 1 of the semiconductor chip 10 by a predetermined gap spacing.

The second ends 34 of the bonding members 30, which are respectively connected to the plurality of bonding pads 4 via the first ends 32, can be arranged in various directions or in the same direction when viewed on a plane.

In the current embodiment of the present invention, the number of manufacturing processes required for manufacture can be significantly reduced in comparison with the conventional art since the bonding members 30, which serve as redistribution lines, are formed using conductive wires or a lead frame.

Figure 2:
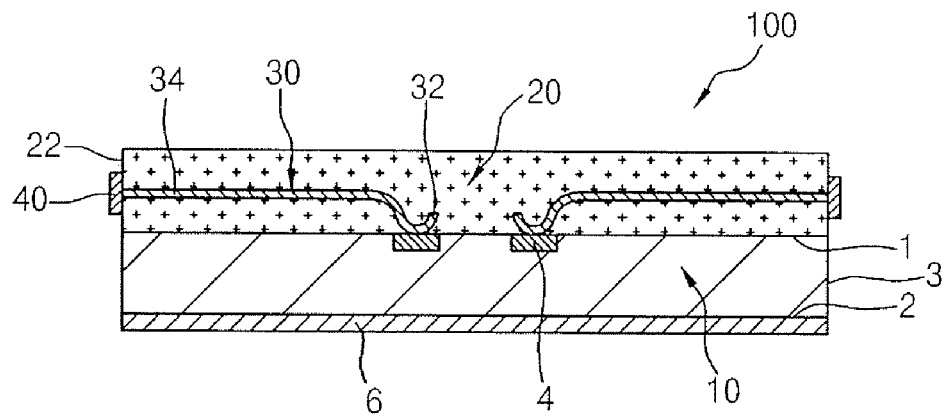
FIG. 2 is a cross-sectional view showing a semiconductor package in accordance with another embodiment of the present invention.

FIG. 2 is a cross-sectional view showing a semiconductor package in accordance with another embodiment of the present invention. The semiconductor package shown in FIG. 2 has substantially the same configuration as the semiconductor package described above with reference to FIG. 1; however, the semiconductor package shown in FIG. 2 includes enlarged pads. Therefore, a description for the same component parts shared between the two embodiments will be omitted herein. The same technical terms and the same reference numerals will also be used to refer to the same or like component parts for simplicity.

Referring to FIG. 2, a semiconductor package 100 includes a semiconductor chip 10, a molding member 20, bonding members 30, and enlarged pads 40.

The enlarged pads 40 are disposed, for example, on the side surfaces 22 of the molding member 20. The enlarged pads 40 are electrically and physically connected to the second ends 34 of the bonding members 30, which are exposed from the side surfaces 22 of the molding member 20. In the current embodiment, the enlarged pads 40 function to increase the areas of the second ends 34 of the bonding members 30 exposed through the molding member 20. That is, the enlarged pads 40 are electrically and physically connected to the second ends 34 of the bonding members 30 and due to their increased size, effectively increase the area of the second ends 34 of the bonding members by several to several hundred times.

Conductive balls, such as solder balls, conductive bonding wires, and connection pads of an external circuit board, can therefore be electrically connected to the enlarged pads 40 much easier. Additionally, two or more semiconductor packages 100 can be electrically connected to one another in a simple manner using the enlarged pads 40 of each semiconductor package 100.

Figure 3:
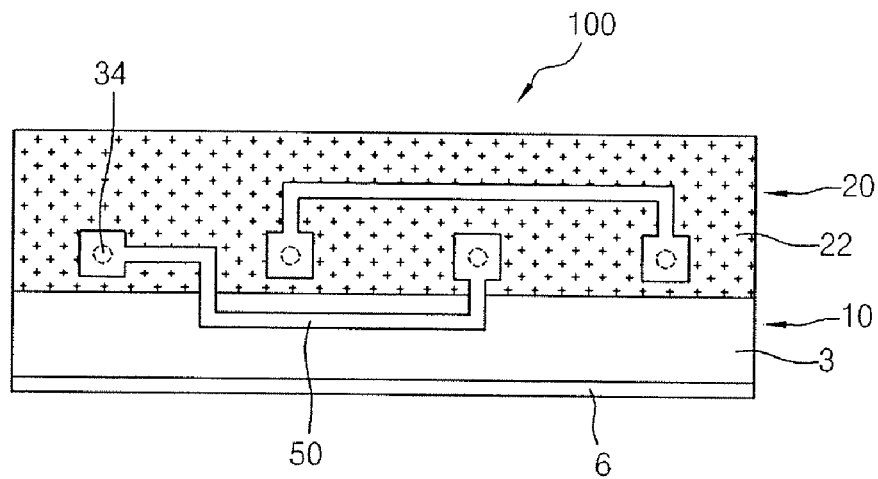
FIG. 3 is a side view showing a side surface of a semiconductor package in accordance with another embodiment of the present invention.

FIG. 3 is a side view showing a side surface of a semiconductor package in accordance with another embodiment of the present invention. The semiconductor package shown in FIG. 3 has substantially the same construction as the semiconductor package described above with reference to FIG. 1; however, the semiconductor package shown in FIG. 3 includes additional bonding members. Therefore, a description for the same component parts shared between the embodiments will be omitted herein. The same technical terms and the same reference numerals will also be used to refer to the same or like component parts for simplicity.

Referring to FIG. 3, a semiconductor package 100 includes a semiconductor chip 10, a molding member 20, bonding members 30, and additional bonding members 50.

The additional bonding members 50 can be disposed on the side surfaces 22 of the molding member 20 and/or the side surfaces 3 of the semiconductor chip 10.

The additional bonding members 50 electrically connect at least two of the second ends 34 of the plurality of bonding members 30 exposed from the side surfaces 22 of the molding member 20. In an embodiment of the present invention, the additional bonding members 50, which electrically connect at least two bonding members 30, can serve as repairing members.

At least one of a conductive wire, a conductive tape, a conductive ink, a metal pattern, an anisotropic conductive film (ACF), and a conductive polymer substance can be used to form the additional bonding members 50. The additional bonding members 50 can electrically connect not only the second ends 34 of the bonding members 30 included in one semiconductor package 100, but may also connect the bonding members 30 of at least two stacked semiconductor packages 100. That is, the additional bonding members 50 may connect together second ends 34 of bonding members 30 from at least two semiconductor packages 100.

Figure 4:
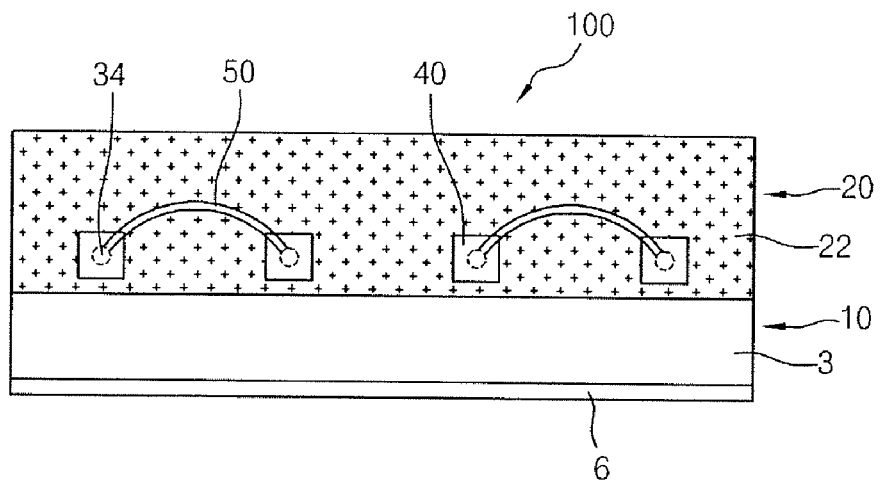
FIG. 4 is a side view showing a side surface of a semiconductor package in accordance with another embodiment of the present invention.

It is also conceivable that, as shown in FIG. 4, the enlarged pads 40 may be formed on the second ends 34 of the bonding members 30 exposed from the side surfaces 22 of the molding member 20 and the additional bonding members 50, e.g., conductive wires, are used to electrically connect at least two enlarged pads 40.

Figure 5:
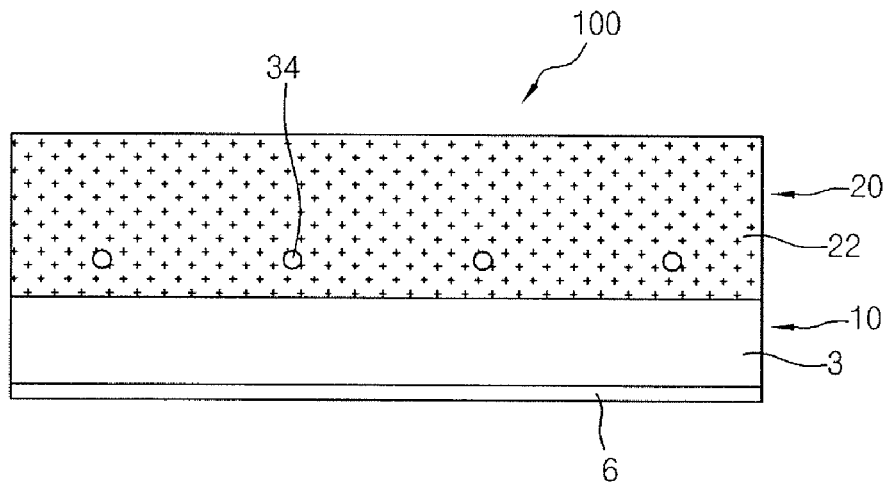
FIGS. 5 through 7 are side views showing side surfaces of semiconductor packages in accordance with other embodiments of the present invention.
Figure 6:
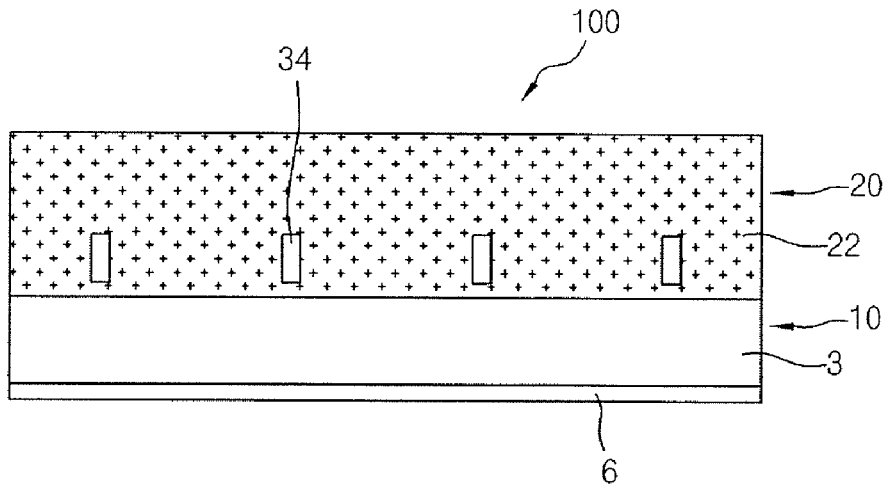
Figure 7:
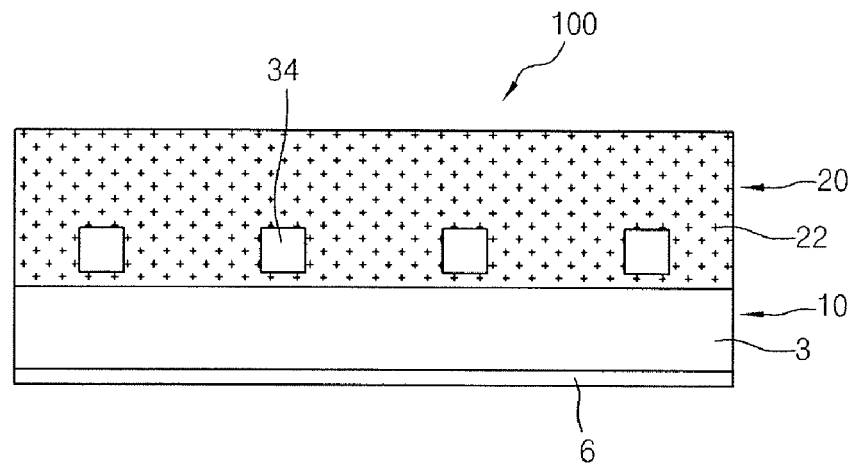

FIGS. 5 through 7 are side views showing side surfaces 22 of semiconductor packages in accordance with other embodiments of the present invention. The semiconductor packages according to these embodiments of the present invention have substantially the same construction as the semiconductor package described above with reference to FIG. 1; however, the shape and the structure of the second ends 34 of the bonding members varies in the semiconductor packages shown in FIGS. 5 through 7. Therefore, a description for the same component parts will be omitted herein. The same technical terms and the same reference numerals will also be used to refer to the same or like component parts for simplicity.

Referring to FIGS. 5 through 7, the respective second ends 34 of the bonding members 30 exposed from the side surfaces 22 of the molding member 20 may have a sectional shape of a point as shown in FIG. 5, a line as shown in FIG. 6, and an area as shown in FIG. 7.

More specifically, the bonding members 30 having the sectional shape of a line as shown in FIG. 6 can be formed by extending the second ends 34 of the bonding members 30 beyond the side surfaces 22 of the molding member 20 and subsequently bending the second ends 34 of the bonding members 30 against the side surfaces 22 of the molding member 20. The bonding members 30 having the sectional shape of an area as shown in FIG. 7 can be formed by conducting a plating process for the bonding members 30 having the sectional shape of a point or a line as shown in FIGS. 5 and 6.

Figure 8:
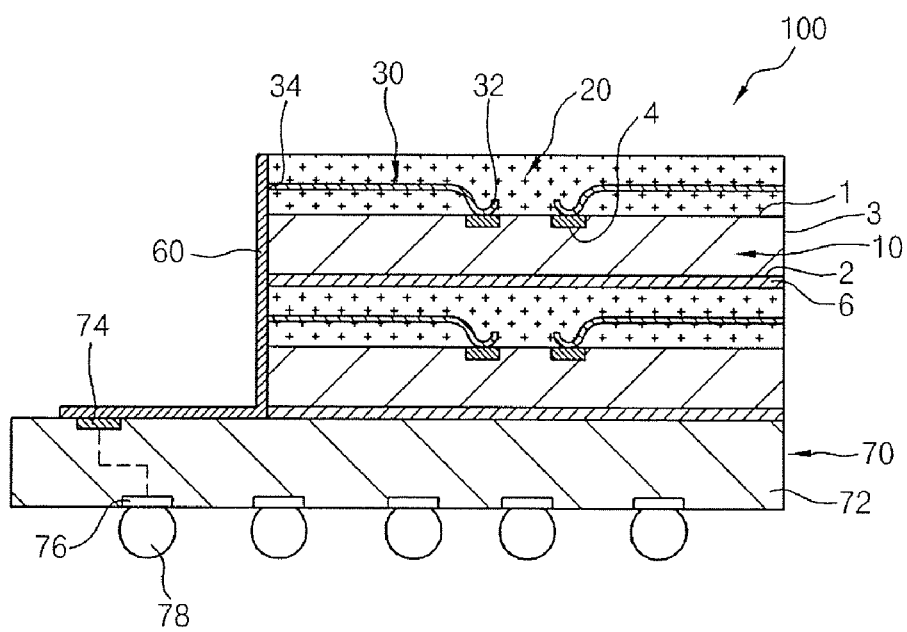
FIG. 8 is a cross-sectional view showing a semiconductor package in accordance with another embodiment of the present invention.

FIG. 8 is a cross-sectional view showing a semiconductor package in accordance with another embodiment of the present invention. The semiconductor package shown in FIG. 8 has substantially the same construction as the semiconductor package described above with reference to FIG. 1; however, the semiconductor package shown in FIG. 8 includes a substrate and connecting members. Therefore, a description for the same component parts will be omitted herein. The same technical terms and the same reference numerals will also be used to refer to the same or like component parts for simplicity.

Referring to FIG. 8, a semiconductor package 100 includes a semiconductor chip 10, a molding member 20, bonding members 30, connecting members 60, and a substrate 70.

The substrate 70 has the shape of, for example, a plate. Connection pads 74 are formed on an upper surface of the substrate 70. Ball lands 76 are disposed on a lower surface of the substrate 70 opposite the upper surface and are electrically connected to the connection pads 74. Conductive balls 78, such as solder balls, are disposed on the respective ball lands 76. In an embodiment of the present invention, the connection pads 74 can be disposed adjacent to the edges of the substrate 70.

The second surface 2 of the semiconductor chip 10 is placed on the upper surface of the substrate 70 and not covering the connection pads 74. In an embodiment of the present invention, at least two semiconductor chips 10 having molding members 20 may be stacked consecutively on the upper surface of the substrate 70.

The connecting members 60 electrically connect the second ends 34 of the bonding members 30 exposed from the side surfaces 22 of the respective molding members 20 and the connection pads 74 of the substrate 70.

In an embodiment of the present invention, each connecting member 60 can comprise any one of a conductive wire, a conductive tape, a conductive ink, a metal pattern, an anisotropic conductive film, and a conductive polymer substance.

Figure 9:
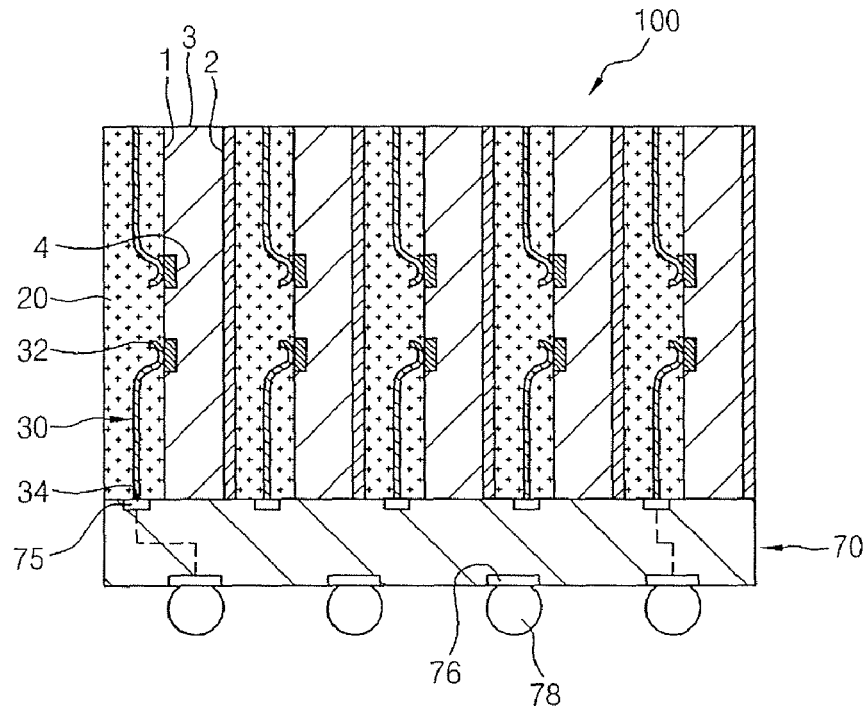
FIG. 9 is a cross-sectional view showing a semiconductor package in accordance with another embodiment of the present invention.

FIG. 9 is a cross-sectional view showing a semiconductor package in accordance with another embodiment of the present invention. The semiconductor package shown in FIG. 9 has substantially the same construction as the semiconductor package described above with reference to FIG. 1; however the semiconductor package in FIG. 9 includes a substrate. Therefore, a description for the same component parts will be omitted herein. The same technical terms and the same reference numerals will also be used to refer to the same or like component parts for simplicity.

Referring to FIG. 9, a semiconductor package 100 includes a semiconductor chip 10, a molding member 20, bonding members 30, and a substrate 70.

The substrate 70 has the shape of, for example, a plate. A plurality of connection pads 75 are serially disposed on an upper surface of the substrate 70. Ball lands 76 are disposed on a lower surface of the substrate 70 opposite the upper surface and are electrically connected to the connection pads 75. Conductive balls 78, such as solder balls, are disposed on the respective ball lands 76.

The side surface 3 of the semiconductor chip 10 is placed on the upper surface of the substrate 70. In other words, the semiconductor chip 10 is placed vertically with respect to the substrate 70. More simply, the semiconductor chip 10 is disposed on the substrate 70 perpendicular to the substrate 70. The second ends 34 of the bonding members 30 exposed from the side surface 22 of the molding member 20 are electrically connected to the connection pads 75 that are disposed on the upper surface of the substrate 70. In an embodiment of the present invention, enlarged pads 40 can be formed on the respective second ends 34 of the bonding members 30 exposed from the side surface 22 of the molding member 20 as shown in FIG. 2 to improve the contact characteristics of the bonding members 30 with respect to the connection pads 75. Solder can be interposed between the enlarged pads 40 and the connection pads 75. That is, the connection pads 75 are formed such that when the semiconductor chips 10 are disposed on the substrate 70, the second ends 34 of the bonding members 30 contact the connection pads 75 as shown in FIG. 9.

In an embodiment of the present invention, at least two semiconductor chips 10 can be placed on the substrate 70 such that the side surfaces 3 of the semiconductor chips 10 face the upper surface of the substrate 70.

Figure 10:
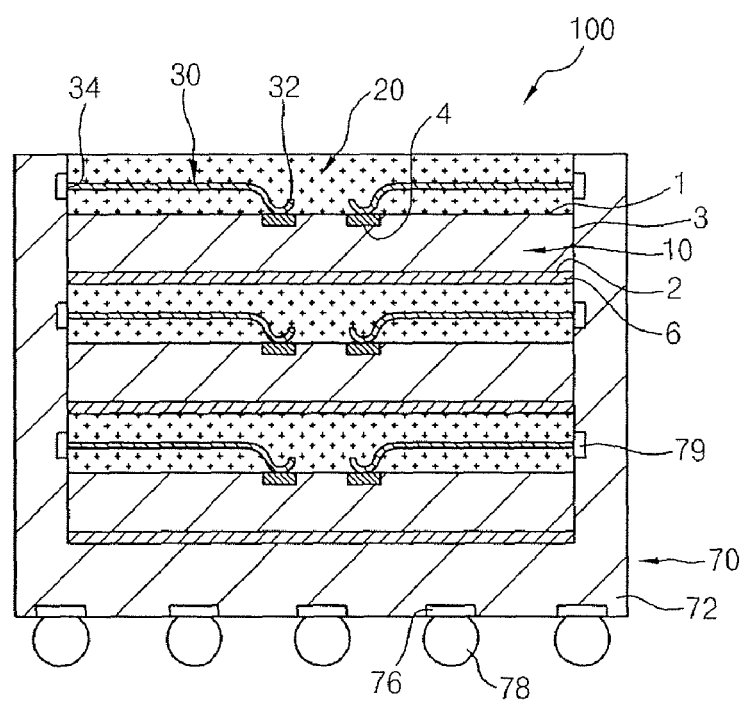
FIG. 10 is a cross-sectional view showing a semiconductor package in accordance with another embodiment of the present invention.

FIG. 10 is a cross-sectional view showing a semiconductor package in accordance with another embodiment of the present invention. The semiconductor package shown in FIG. 10 has substantially the same construction as the semiconductor package described above with reference to FIG. 1; however the semiconductor package in FIG. 10 includes a substrate. Therefore, a description for the same component parts will be omitted herein. The same technical terms and the same reference numerals will also be used to refer to the same or like component parts for simplicity.

Referring to FIG. 10, a semiconductor package 100 includes a semiconductor chip 10, a molding member 20, bonding members 30, and a substrate 70.

The substrate 70 has the shape of, for example, a plate. The substrate 70 is then bent so that the semiconductor chip 10 can be received in the bent substrate 70. That is, the substrate 70 is bent to form a 'U' shape allowing the semiconductor chip 10 to fit inside the bent substrate 70. As a result, portions of the substrate 70 face the side surfaces 3 of the semiconductor chip 10 and the side surfaces 22 of the molding member 20. Connection pads 79 are disposed on the portions of the substrate 70 that face the side surfaces 3 of the semiconductor chip 10 and the side surfaces 22 of the molding member 20. The connection pads 79 are electrically connected, by means of solder, etc., to the second ends 34 of the bonding members 30 exposed from the side surfaces 22 of the molding member 20.

In an embodiment of the present invention, at least two semiconductor chips 10 can be stacked on the substrate 70, each of which having the molding member 20 placed on the first surface 1 thereof.

Figure 11:
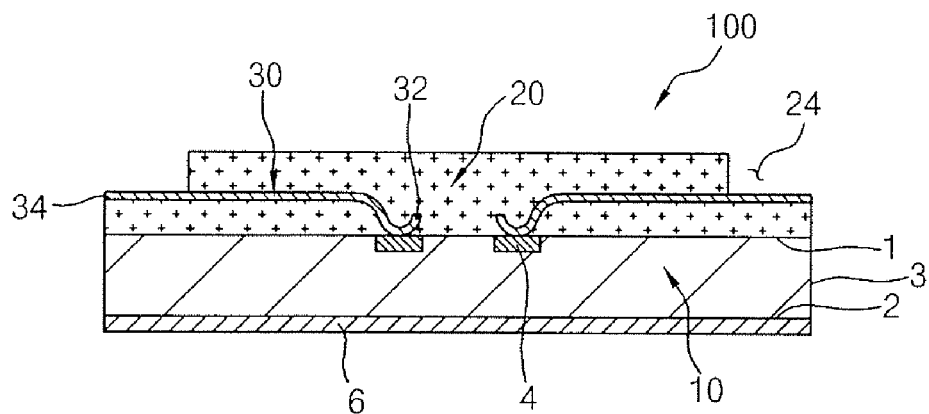
FIG. 11 is a cross-sectional view showing a semiconductor package in accordance with another embodiment of the present invention.

FIG. 11 is a cross-sectional view showing a semiconductor package in accordance with another embodiment of the present invention. The semiconductor package shown in FIG. 11 has substantially the same construction as the semiconductor package described above with reference to FIG. 1; however, the semiconductor package includes a molding member. Therefore, a description for the same component parts will be omitted herein. The same technical terms and the same reference numerals will also be used to refer to the same or like component parts for simplicity.

Referring to FIG. 11, a semiconductor package 100 includes a semiconductor chip 10, a molding member 20, and bonding members 30.

The molding member 20 has openings 24 that expose portions of the bonding members 30, the bonding members 30 having the second ends 34 exposed from the side surfaces 22 of the molding member 20.

Figure 12:
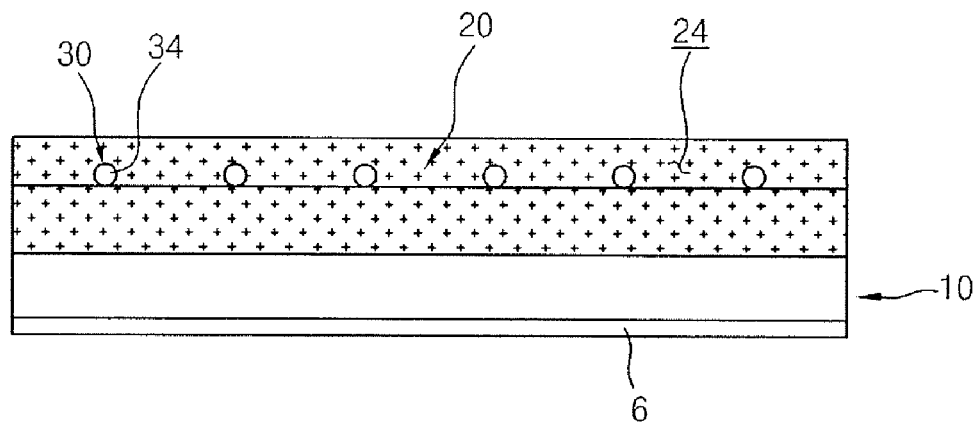
FIGS. 12 and 13 are side views showing openings defined in a molding member according to the present invention.

In an embodiment of the present invention, the openings 24 can be defined by entirely removing the side and upper portions of the molding member 20 as shown in FIG. 12 so as to define the shape of a step. That is, a portion of the molding member 20 parallel to the side surfaces 22 of the molding member 20 and the portion of the molding member 20 formed at or above the bonding members 30 is removed. As a result, the second end portions of the bonding members 30 are exposed in the form of lines for a predetermined length when viewed from the top.

Figure 13:
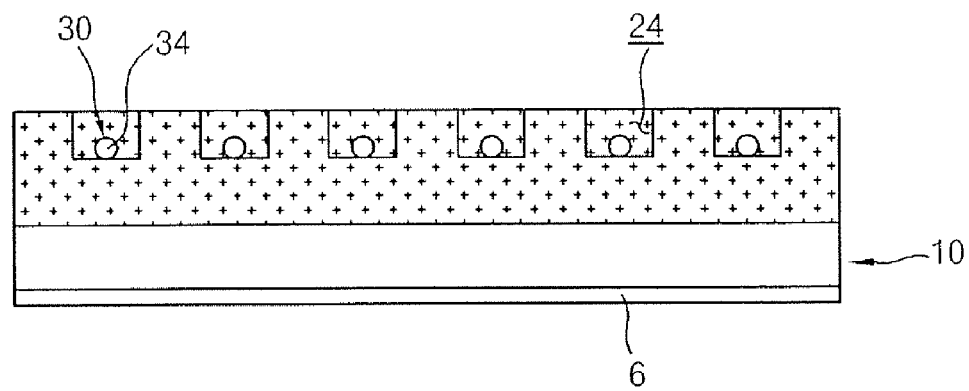

In an embodiment of the present invention, the openings 24 can also be defined by only partially removing the side and upper portions of the molding member 20 corresponding to the second ends 34 of the bonding members 30 as shown in FIG. 13 to define recesses at the second ends 34 of the bonding members 30. As a result, the second end portions of the bonding members 30 are exposed in the form of lines for a predetermined length when viewed from the top.

Figure 14:
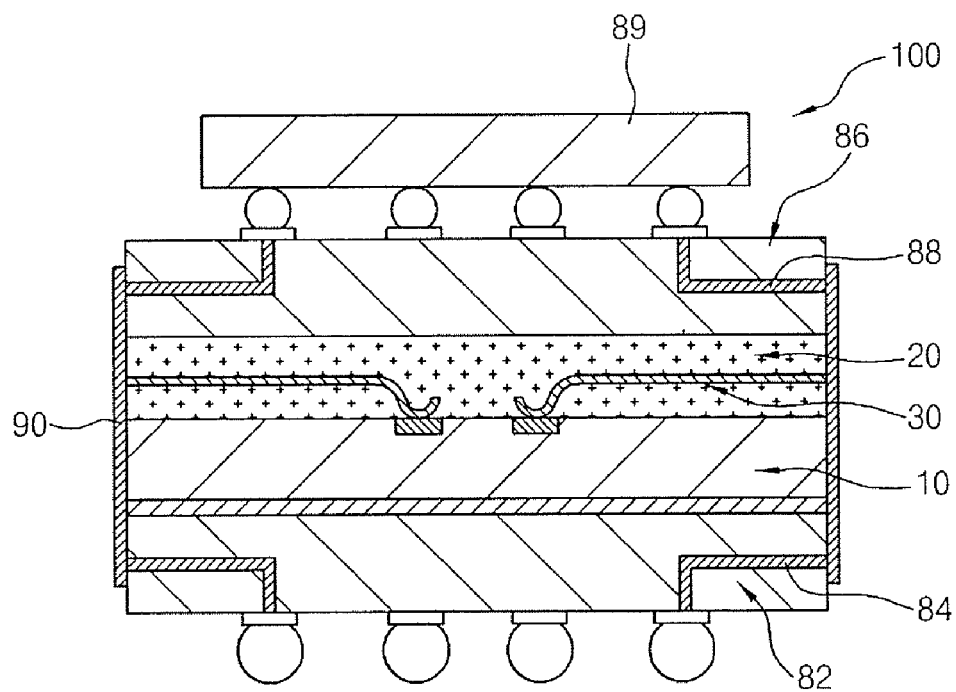
FIG. 14 is a cross-sectional view showing a semiconductor package in accordance with another embodiment of the present invention.

FIG. 14 is a cross-sectional view showing a semiconductor package in accordance with another embodiment of the present invention. The semiconductor package shown in FIG. 14 has substantially the same construction as the semiconductor package described above with reference to FIG. 1; however the semiconductor package of FIG. 14 includes a first substrate, a second substrate, connecting members, and an additional semiconductor package. Therefore, a description for the same component parts will be omitted herein. The same technical terms and the same reference numerals will also be used to refer to the same or like component parts for simplicity.

Referring to FIG. 14, a semiconductor package 100 includes a semiconductor chip 10, a molding member 20, bonding members 30, a first substrate 82, a second substrate 86, and connecting members 90.

The first substrate 82 has the shape of a plate. The first substrate 82 includes first metal lines 84 that connect a lower surface and side surfaces of the first substrate 82. The first metal lines 84 are electrically connected to ball lands that are disposed on the lower surface of the first substrate 82.

The second substrate 86 has the shape of a plate. The second substrate 86 includes second metal lines 88 that connect an upper surface and side surfaces of the second substrate 86. The second metal lines 88 are electrically connected to ball lands that are disposed on the upper surface of the second substrate 86.

The semiconductor chip 10 having the molding member 20 is interposed between the first substrate 82 and the second substrate 86. In an embodiment of the present invention, the second surface 2 of the semiconductor chip 10 is placed over the upper surface of the first substrate 82, and the second substrate 86 is placed on the molding member 20. An adhesive member is optionally interposed between the first substrate 82 and the semiconductor chip 10.

The connecting members 90 electrically connect the first metal lines 84 of the first substrate 82 and the second metal lines 88 of the second substrate 86. The connecting members 90 are electrically connected to the bonding members 30 that are exposed from the side surfaces 22 of the molding member 20.

An additional semiconductor package 89 is electrically connected to the ball lands formed on the upper surface of the second substrate 86. In an embodiment of the present invention, the additional semiconductor package 89 can be electrically connected to the second substrate 86, for example, in a flip-chip type.

Figure 15:
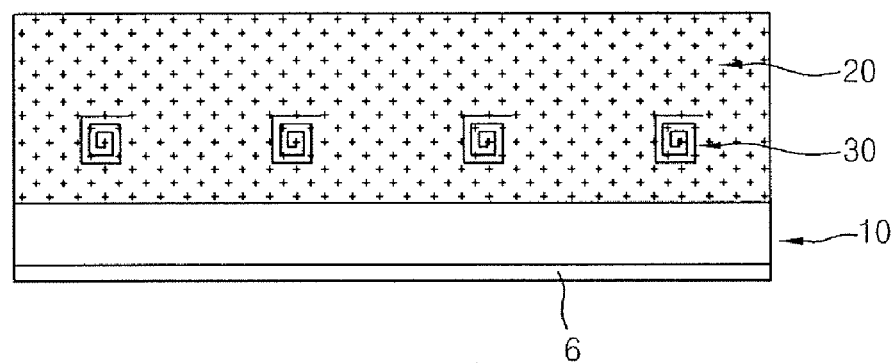
FIG. 15 is a side view showing a semiconductor package in accordance with another embodiment of the present invention.

FIG. 15 is a side view showing a semiconductor package in accordance with another embodiment of the present invention. The semiconductor package shown in FIG. 15 has substantially the same construction as the semiconductor package described above with reference to FIG. 1; however, the semiconductor package in FIG. 15 includes bonding members. Therefore, a description for the same component parts will be omitted herein. The same technical terms and the same reference numerals will also be used to refer to the same or like component parts for simplicity.

Referring to FIG. 15, a semiconductor package 100 includes a semiconductor chip 10, a molding member 20, and bonding members 30.

The bonding members 30 have second end portions that project from the side surfaces 22 of the molding member 20 by a pre-determined length. Each of the second end portions of the bonding members 30 has a shape in which it is bent at least one time. In an embodiment of the present invention, each of the second end portions of the bonding members 30 can have the shape of, for example, a spring which is wound several times. By bending the second end portions of the bonding members 30, the surface area of the second ends 34 of the bonding members 30 exposed from the side surfaces 22 of the molding member 20 can be increased considerably.

Figure 16:
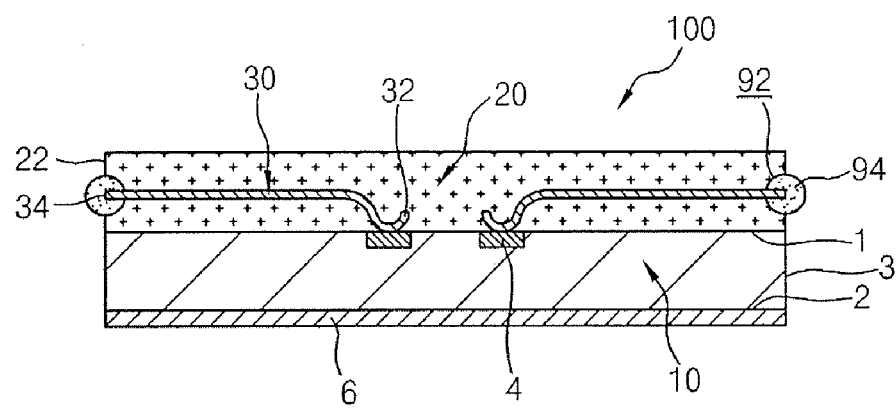
FIG. 16 is a cross-sectional view showing a semiconductor package in accordance with another embodiment of the present invention.

FIG. 16 is a cross-sectional view showing a semiconductor package in accordance with another embodiment of the present invention. The semiconductor package shown in FIG. 16 has substantially the same construction as the semiconductor package described above with reference to FIG. 1; however, the semiconductor package in FIG. 16 includes a molding member and solder balls. Therefore, a description for the same component parts will be omitted herein. The same technical terms and the same reference numerals will also be used to refer to the same or like component parts for simplicity.

Referring to FIG. 16, a semiconductor package 100 includes a semiconductor chip 10, a molding member 20, bonding members 30, and solder balls 94.

The molding member 20 has concave grooves 92 defined on the side surfaces 22 of the molding member 20. In the current embodiment, the second end portions of the bonding members 30 are exposed due to presence of the concave grooves 92 on the side surfaces 22 of the molding member 20. In an embodiment of the present invention, the concave grooves 92 are formed to have a sectional shape of, for example, a hemisphere.

Solder balls 94 are disposed in the grooves 92 defined on the side surfaces 22 of the molding member 20. The solder balls 94 and are electrically connected to the second ends 34 of the bonding members 30.

Figure 17:
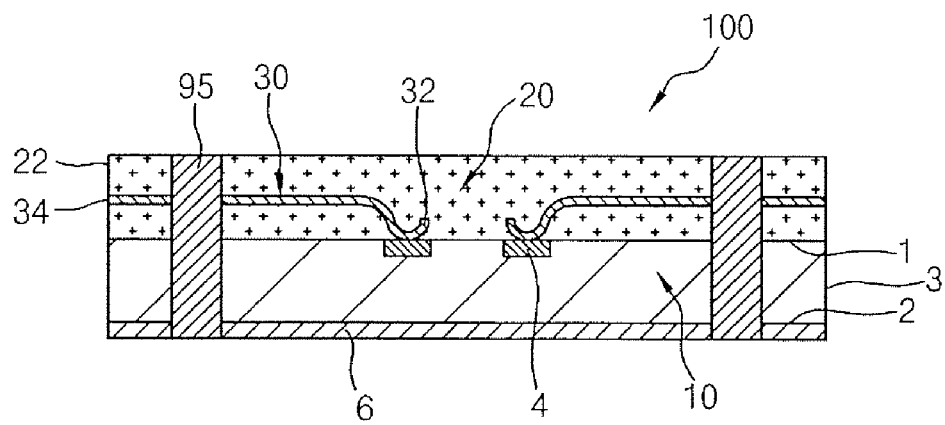
FIG. 17 is a cross-sectional view showing a semiconductor package in accordance with another embodiment of the present invention.

FIG. 17 is a cross-sectional view showing a semiconductor package in accordance with another embodiment of the present invention. The semiconductor package shown in FIG. 17 has substantially the same construction as the semiconductor package described above with reference to FIG. 1; however, the semiconductor package in FIG. 17 includes through-electrodes. Therefore, a description for the same component parts will be omitted herein. The same technical terms and the same reference numerals will also be used to refer to the same or like component parts for simplicity.

Referring to FIG. 17, a semiconductor package 100 includes a semiconductor chip 10, a molding member 20, bonding members 30, and through-electrodes 95.

The through-electrodes 95 pass through the semiconductor chip 10 and the molding member 20. The through-electrodes 95 can be electrically connected to, for example, the bonding members 30. Alternatively, the through-electrodes 95 can be separated from the bonding members 30 by a preset distance.

Figure 18:
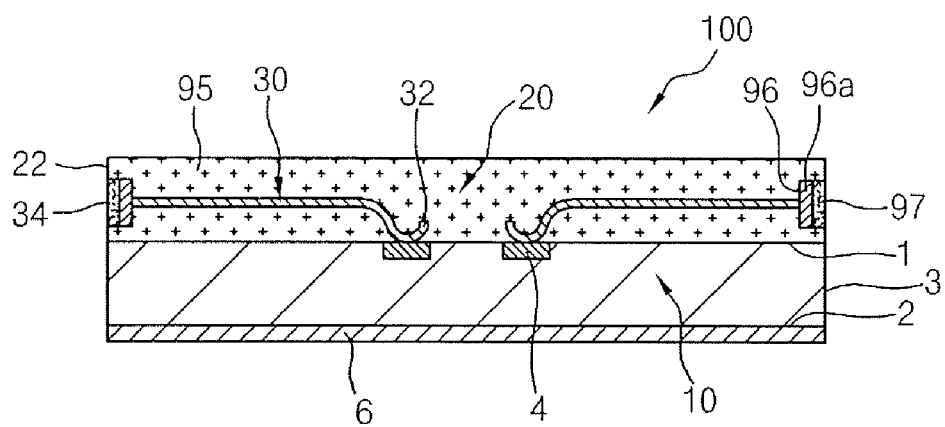
FIG. 18 is a cross-sectional view showing a semiconductor package in accordance with another embodiment of the present invention.

FIG. 18 is a cross-sectional view showing a semiconductor package in accordance with another embodiment of the present invention. The semiconductor package shown in FIG. 18 has substantially the same construction as the semiconductor package described above with reference to FIG. 1; however, the semiconductor package in FIG. 18 includes recesses, additional bonding members, and insulating members. Therefore, a description for the same component parts will be omitted herein. The same technical terms and the same reference numerals will also be used to refer to the same or like component parts for simplicity.

Referring to FIG. 18, a semiconductor package 100 includes a semiconductor chip 10, a molding member 20, and bonding members 30.

Recesses 96 having a groove or trench shape are defined on the side surfaces 22 of the molding member 20. In an embodiment of the present invention, each recess 96 exposes at least two of the second ends 34 of the bonding members 30.

Additional bonding members 96a are formed in the recesses 96 and are electrically connected to the second ends 34 of the bonding members 30 exposed in the respective recesses 96. The recesses 96, having the additional bonding members 96a formed therein, are electrically insulated by insulating members 97.

In the current embodiment, the additional bonding members 96 do not project from the side surfaces 22 of the molding member 20. The additional bonding members 96 do not project from the molding member 20 due to the recesses 96 being defined in the molding member 20 and disposing the additional bonding members 96a and the insulating members 97 within the recesses 96.

Figure 19:
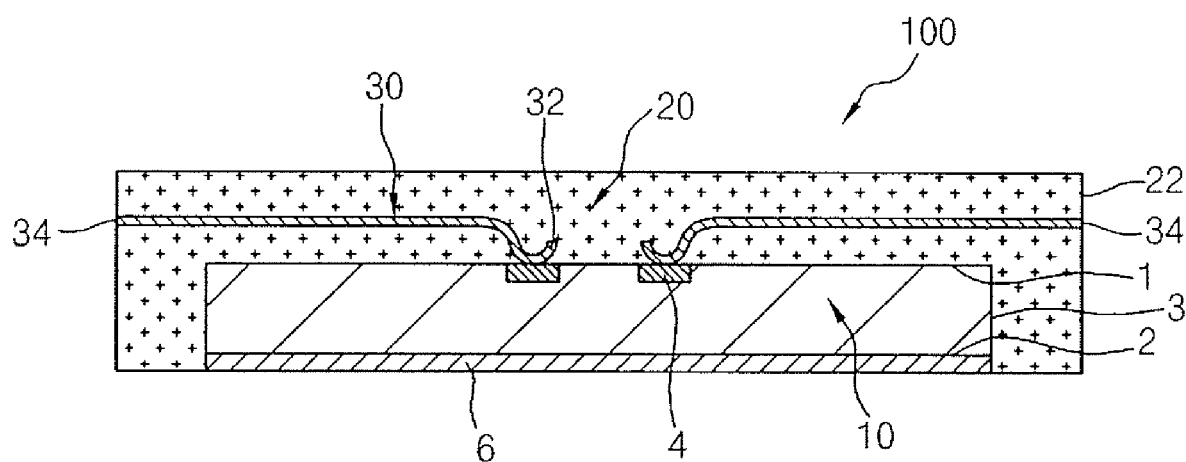
FIG. 19 is a cross-sectional view showing a semiconductor package in accordance with another embodiment of the present invention.

FIG. 19 is a cross-sectional view showing a semiconductor package in accordance with another embodiment of the present invention. The semiconductor package shown in FIG. 19 has substantially the same construction as the semiconductor package described above with reference to FIG. 1; however, the semiconductor package in FIG. 19 includes a molding member. Therefore, a description for the same component parts will be omitted herein. The same technical terms and the same reference numerals will also be used to refer to the same or like component parts for simplicity.

Referring to FIG. 19, a semiconductor package 100 includes a semiconductor chip 10, a molding member 20, and bonding members 30.

As shown in FIG. 19, the molding member 20 covers not only the upper surface of the semiconductor chip 10 but also the side surfaces 3 of the semiconductor chip 10 that meet the upper surface 1. In an embodiment of the present invention, through-electrodes can be formed adjacent to the side surfaces 3 of the semiconductor chip 10 to pass through the molding member 20.

The through-electrodes can be electrically connected to the bonding members 30.

As is apparent from the above description, the present invention simplifies the manufacturing processes of a semiconductor package and significantly reduces the manufacturing cost since conductive wires or lead frames are used to serve as the redistribution lines of a wafer level package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip possessing a first surface, a second surface opposite the first surface, and side surfaces connecting the first and second surfaces, and having bonding pads disposed on the first surface;
   a molding member covering the first surface of the semiconductor chip and exposing the side surfaces of the semiconductor chip;
   bonding members formed within the molding member, each bonding member having a first end and a second end opposite the first end, the first ends electrically connected to respective bonding pads of the semiconductor chip and the second ends being exposed from side surfaces of the molding member after passing through the molding member;
   a single continuous recess formed in a shape of a groove on at least one of the side surfaces of the molding member so as to expose at least two of the second ends of the bonding members at the at least one of the side surfaces of the molding member; and
   additional bonding members disposed in the single continuous recess each electrically connecting at least two of the second ends of the bonding members exposed in the respective recess.

2. The semiconductor package according to claim 1, further comprising:
   enlarged pads disposed on the side surfaces of the molding member and electrically connected with the second ends of the bonding members, wherein the enlarged pads have a surface area larger than a surface area of the exposed second ends of the bonding members.

3. The semiconductor package according to claim 1, wherein each additional bonding member comprises any one selected from the group consisting of a conductive wire, a conductive tape, a conductive ink, a metal pattern, an anisotropic conductive film, and a conductive polymer substance.

4. The semiconductor package according to claim 1, wherein the second ends of the bonding members exposed from the side surfaces of the molding member have a sectional shape of any one of a point, a line, and a surface area.

5. The semiconductor package according to claim 1, further comprising:
   a substrate having the second surface of the semiconductor chip placed thereon, the substrate having connection pads disposed outside the semiconductor chip; and
   connecting members electrically connecting the second ends of the bonding members exposed from the side surfaces of the molding member and the connection pads.

6. The semiconductor package according to claim 5, wherein each connecting member comprises any one selected from the group consisting of a conductive wire, a conductive tape, a conductive ink, a metal pattern, an anisotropic conductive film, and a conductive polymer substance.

7. The semiconductor package according to claim 1, further comprising:
   a substrate having one of the side surfaces of the semiconductor chip placed thereon, the substrate having connection pads electrically connected to the second ends of the bonding members exposed from the side surfaces of the molding member.

8. The semiconductor package according to claim 1, further comprising:
   a substrate having second surfaces of at least two semiconductor chips consecutively stacked thereon, the substrate having bent portions and connection pads electrically connected to the second ends of the bonding members exposed from the side surfaces of the molding member,
   wherein the bent portions of the substrate are bent to adjacently face the side surfaces of the molding member.

9. The semiconductor package according to claim 1, further comprising:
   a first substrate comprising a first substrate body, an upper surface of the first substrate body contacting the second surface of the semiconductor chip, and first metal lines having first ends disposed on a lower surface opposite the upper surface of the first substrate body and second ends disposed on side surfaces of the first substrate body;
   a second substrate comprising a second substrate body, a lower surface of the second substrate body disposed on an upper surface of the molding member of the semiconductor chip, and second metal lines having first ends disposed on an upper surface opposite the lower surface of the second substrate body and second ends disposed on side surfaces of the second substrate body; and
   connecting members electrically connecting the second ends of the first metal lines and the second ends of the second metal lines.

10. The semiconductor package according to claim 9, further comprising:
    an additional semiconductor package electrically connected to the first ends of the second metal lines.

11. The semiconductor package according to claim 1, wherein the bonding members comprise a conductive lead frame having a shape of a band.

12. The semiconductor package according to claim 1, wherein the bonding members comprise conductive bonding wires.

13. The semiconductor package according to claim 1, further comprising:
   through-holes formed to pass through the semiconductor chip, the molding member, and the bonding members;
   through-electrodes disposed in the through-holes and electrically connected to the bonding members.

14. The semiconductor package according to claim 1, further comprising:
   insulating members disposed in the recess and over the additional bonding members to insulate the additional bonding members from one another.

15. A semiconductor package comprising:
   a semiconductor chip possessing a first surface, a second surface opposite the first surface, and side surfaces connecting the first and second surfaces, and having bonding pads disposed on the first surface;
   a molding member covering the first surface of the semiconductor chip and the side surfaces of the semiconductor chip;
   bonding members formed within the molding member, each bonding member having a first end and a second end opposite the first end, the first ends electrically connected to respective bonding pads of the semiconductor chip and the second ends being exposed from side surfaces of the molding member after passing through the molding member;
   a single continuous recess formed in a shape of a groove on at least one of the side surfaces of the molding member so as to expose at least two of the second ends of the bonding members at the at least one of the side surfaces of the molding member; and
   additional bonding members disposed in the single continuous recess each electrically connecting at least two of the second ends of the bonding members exposed in the respective recess.

* * * * *